United States Patent
Beckhoff et al.

(10) Patent No.: US 11,956,915 B2
(45) Date of Patent: Apr. 9, 2024

(54) SWITCH-CABINET SYSTEM WITH SEALING INSERT

(71) Applicant: Beckhoff Automation GmbH, Verl (DE)

(72) Inventors: Hans Beckhoff, Verl (DE); Peter Wittenborg, Verl (DE); Daniel Siegenbrink, Bielefeld (DE)

(73) Assignee: Beckhoff Automation GmbH, Verl (DE)

( * ) Notice: Subject to any disclaimer, the term of this patent is extended or adjusted under 35 U.S.C. 154(b) by 427 days.

(21) Appl. No.: 17/406,425

(22) Filed: Aug. 19, 2021

(65) Prior Publication Data

US 2021/0385964 A1    Dec. 9, 2021

Related U.S. Application Data

(63) Continuation of application No. PCT/EP2020/056494, filed on Mar. 11, 2020.

(30) Foreign Application Priority Data

Mar. 11, 2019    (DE) .................... 10 2019 106 082.6

(51) Int. Cl.
  *H05K 7/14* (2006.01)
  *H02B 1/30* (2006.01)
  *H05K 9/00* (2006.01)

(52) U.S. Cl.
  CPC .............. *H05K 7/1472* (2013.01); *H02B 1/30* (2013.01); *H05K 7/1479* (2013.01); *H05K 9/0015* (2013.01)

(58) Field of Classification Search
  CPC .. H05K 7/1472; H05K 7/1479; H05K 9/0015; H02B 1/30
  See application file for complete search history.

(56) References Cited

U.S. PATENT DOCUMENTS

| | | |
|---|---|---|
| 789,671 A | 5/1905 | Reich |
| 4,152,750 A | 5/1979 | Bremenour et al. |
| (Continued) | | |

FOREIGN PATENT DOCUMENTS

| | | |
|---|---|---|
| CN | 1662128 A | 8/2005 |
| CN | 1684578 A | 10/2005 |
| (Continued) | | |

OTHER PUBLICATIONS

Office Action dated Jun. 8, 2022 in connection with Chinese Patent Application No. 2022800020520.2, 9 pages including English translation.

(Continued)

*Primary Examiner* — Anthony Q Edwards
*Assistant Examiner* — Hung Q Dang
(74) *Attorney, Agent, or Firm* — Dorsey & Whitney LLP (57) ABSTRACT

A switch-cabinet system comprises a base module with a base housing and at least one functional module with a functional housing. A functional connection element is arranged in the functional housing in the area of a first through-opening on a bottom side of the functional housing. A base connection element is arranged in the base housing in the area of a second through opening on a top side of the base housing. The bottom side of the functional housing rests against the top side of the base housing. The functional and base connection elements engage and form an interface. The system also includes a sealing insert having a frame with a functional section engaging the functional housing and a base section engaging the base housing. The functional section abuts an inner wall of the functional housing. The base section abuts a wall of the base housing defining the second through-opening.

11 Claims, 7 Drawing Sheets

(56) References Cited

U.S. PATENT DOCUMENTS

| | | |
|---|---|---|
| 5,493,194 A | 2/1996 | Damiano et al. |
| 5,510,960 A | 4/1996 | Rosen |
| 5,716,241 A | 2/1998 | Hennemann et al. |
| 5,761,052 A | 6/1998 | Wheeler-King et al. |
| 6,123,585 A | 9/2000 | Hussong et al. |
| 6,172,875 B1 | 1/2001 | Suzuki et al. |
| 6,172,877 B1 | 1/2001 | Feye-Hohmann et al. |
| 6,881,101 B2 | 4/2005 | Sichner et al. |
| 6,916,194 B2 | 7/2005 | Sichner et al. |
| 7,021,974 B2 | 4/2006 | Sichner et al. |
| 7,257,003 B2 | 8/2007 | Ono |
| 7,277,286 B2 | 10/2007 | Lee |
| 7,397,668 B2 | 7/2008 | Sekine et al. |
| 7,616,453 B2 | 11/2009 | Bergmann |
| 7,724,521 B2 | 5/2010 | Nelson et al. |
| 7,753,740 B2 | 7/2010 | De Carolis et al. |
| 7,933,104 B2 | 4/2011 | Bauer et al. |
| 7,967,646 B2 | 6/2011 | De Carolis et al. |
| 8,891,220 B2 | 11/2014 | Shimizu et al. |
| 9,112,318 B2 | 8/2015 | Cech et al. |
| 9,456,518 B2 | 9/2016 | Bury et al. |
| 9,474,187 B2 | 10/2016 | Nelson et al. |
| 9,936,598 B2 * | 4/2018 | Gruber .................. H01R 9/2675 |
| 9,992,898 B2 | 6/2018 | Tsutsumi et al. |
| 10,136,528 B2 * | 11/2018 | Budde .................. H05K 7/1484 |
| 10,140,226 B2 | 11/2018 | Veil et al. |
| 11,533,820 B2 * | 12/2022 | Beckhoff ............. H05K 7/1468 |
| 11,540,413 B2 * | 12/2022 | Siegenbrink ......... H05K 7/1452 |
| 2004/0201972 A1 | 10/2004 | Walesa |
| 2005/0185381 A1 | 8/2005 | Ono |
| 2006/0126277 A1 | 6/2006 | Tomkowiak |
| 2006/0136622 A1 | 6/2006 | Rouvelin et al. |
| 2006/0259670 A1 | 11/2006 | Meinke et al. |
| 2007/0066147 A1 | 3/2007 | Braunlich et al. |
| 2009/0021920 A1 | 1/2009 | Hund et al. |
| 2009/0309467 A1 | 12/2009 | Nelson et al. |
| 2009/0310312 A1 | 12/2009 | Wayman et al. |
| 2010/0103627 A1 | 4/2010 | Nelson et al. |
| 2011/0131455 A1 | 6/2011 | Law et al. |
| 2011/0164350 A1 | 7/2011 | Kanaya et al. |
| 2011/0256749 A1 | 10/2011 | Bayerer |
| 2012/0206881 A1 | 8/2012 | Nelson et al. |
| 2012/0243623 A1 | 9/2012 | Kisakuerek |
| 2013/0336359 A1 | 12/2013 | Zink |
| 2013/0342152 A1 | 12/2013 | Maeda et al. |
| 2014/0160679 A1 | 6/2014 | Kelty |
| 2014/0307367 A1 | 10/2014 | Maeda et al. |
| 2015/0257286 A1 | 9/2015 | Sichmann et al. |
| 2016/0037660 A1 | 2/2016 | Budde et al. |
| 2016/0254612 A1 | 9/2016 | Andrei et al. |
| 2016/0320761 A1 | 11/2016 | Kirsamer et al. |
| 2016/0349721 A1 | 12/2016 | Kang |
| 2017/0374756 A1 | 12/2017 | Leen et al. |
| 2018/0069359 A1 | 3/2018 | Müller et al. |
| 2021/0289653 A1 | 9/2021 | Beckhoff |
| 2021/0289654 A1 * | 9/2021 | Beckhoff ............. H05K 7/1467 |
| 2021/0298189 A1 | 9/2021 | Siegenbrink et al. |

FOREIGN PATENT DOCUMENTS

| | | |
|---|---|---|
| CN | 101080858 A | 11/2007 |
| CN | 101192056 A | 6/2008 |
| CN | 101690019 A | 3/2010 |
| CN | 102047349 B | 5/2013 |
| CN | 103858281 A | 6/2014 |
| CN | 204014380 U | 12/2014 |
| CN | 104662844 A | 5/2015 |
| CN | 105580214 A | 5/2016 |
| CN | 105684563 A | 6/2016 |
| CN | 105746006 A | 7/2016 |
| CN | 105101753 B | 8/2017 |
| CN | 208400835 U | 1/2019 |
| DE | 4140611 C1 | 5/1993 |
| DE | 19525438 A1 | 1/1997 |
| DE | 19651961 A1 | 6/1998 |
| DE | 19748429 A1 | 5/1999 |
| DE | 19748531 A1 | 5/1999 |
| DE | 19902745 A1 | 8/2000 |
| DE | 19923569 A1 | 11/2000 |
| DE | 10006879 A1 | 8/2001 |
| DE | 4437316 C2 | 12/2001 |
| DE | 69715868 T2 | 10/2002 |
| DE | 10148470 A1 | 4/2003 |
| DE | 20211002 U1 | 12/2003 |
| DE | 102004018115 A1 | 11/2005 |
| DE | 102006056001 A1 | 6/2008 |
| DE | 102009005546 A1 | 12/2009 |
| DE | 102006049631 B4 | 3/2011 |
| DE | 102011110184 A1 | 2/2013 |
| DE | 202013003925 U1 | 6/2013 |
| DE | 102012213281 A1 | 1/2014 |
| DE | 102012021055 A1 | 4/2014 |
| DE | 102013202591 A1 | 8/2014 |
| DE | 102016000126 A1 | 7/2016 |
| DE | 112013007698 A5 | 9/2016 |
| DE | 202017104591 U1 | 11/2018 |
| DE | 102018133646 A1 | 7/2020 |
| DE | 102018133647 A1 | 7/2020 |
| DE | 102018133657 A1 | 7/2020 |
| DE | 102019106082 B4 | 6/2021 |
| EP | 0236711 A2 | 9/1987 |
| EP | 0661915 A1 | 7/1995 |
| EP | 0323579 B1 | 3/1997 |
| EP | 0895708 B1 | 10/1999 |
| EP | 1258957 A1 | 11/2002 |
| EP | 1269809 B1 | 10/2004 |
| EP | 1595313 B1 | 6/2007 |
| EP | 1593312 B1 | 8/2008 |
| EP | 1668969 B1 | 10/2009 |
| EP | 2111088 A2 | 10/2009 |
| EP | 2183751 A1 | 5/2010 |
| EP | 1383368 B1 | 12/2010 |
| EP | 2642602 A1 | 9/2013 |
| EP | 2642603 A1 | 9/2013 |
| EP | 2793540 A2 | 10/2014 |
| EP | 2986093 A1 | 2/2016 |
| EP | 3018983 A2 | 5/2016 |
| EP | 3019983 A1 | 5/2016 |
| JP | 2014529781 A | 11/2014 |
| JP | 2016502266 A | 1/2016 |
| JP | 2016092219 A | 5/2016 |
| JP | 2016534422 A | 11/2016 |
| JP | 2018514904 A | 6/2018 |
| JP | 6388770 B2 | 8/2018 |
| WO | 2004057937 A1 | 7/2004 |
| WO | 2008101513 A1 | 8/2008 |
| WO | 2009014530 A1 | 1/2009 |
| WO | 2015063292 A1 | 5/2015 |
| WO | 2015090345 A1 | 6/2015 |
| WO | 2020136010 A2 | 7/2020 |
| WO | 2020136081 A1 | 7/2020 |
| WO | 2020136084 | 7/2020 |
| WO | 2020182877 A1 | 9/2020 |

OTHER PUBLICATIONS

Japanese Office Action dated Jan. 31, 2022 in connection with Japanese patent application No. 2021-53787, 4 pages including English translation.

Office Action dated Feb. 25, 2022 in connection with Chinese patent application No. 20980086931.9, 22 pages including English translation.

Office Action dated Feb. 28, 2022 in connection with Chinese patent application No. 201980086815.7, 24 pages including English translation.

First Office Action dated Mar. 24, 2022 in connection with Chinese patent application No. 201980086871.0, 10 pages including English translation.

"Backplane," Wikipedia, 6 pages, <https://en.wikipedia.org/wiki/Backplane#Active_versus_passive_ . . . >.

"Festo and Rockwell: A partnership built on a shared commitment," <https://www.festo.com/us/en/e/iot-technologies/festo-and-rockwell . . . > 6 pages.

(56) References Cited

OTHER PUBLICATIONS

"I/O-System" Hans Turck GmbH Co. KG, 10 pages, <https://www.turck.de/de/productgroup/Feldbustechnik . . . >.
"Passive Backplanes," Advantech, 1 page, <https://www.advantech.eu/products/passive-backplanes/sub_1-2jkogc>.
"Schaltschrank," Wikipedia, <https://de.wikipedia.org/w/index.php?title=Schaltschrank&oldid=. . . >, 9 pages with English translation.
"Verfahrenstechnik," Wikipedia, <https://de.wikipedia.org/w/index.php?title_Verfahrenstechnik . . . >, 21 pages including English translation.
"Werkzeugmaschine," Wikipedia, <https://de.wikipedia.org/w/index.php?title_Werkzeugmaschine . . . > 49 pages including English translation.
EP9128-Ether_CAT-Sternverteiler in Schutzart IP67—Version 2.2.0, Beckhoff GmbH, Jul. 13, 2015, 45 pages.
"Simatic ET 200, The I/O system for both inside and outside the control cabinet," Siemens, (2015) 18 pages including English translation.
Graphite Module: Crimson Control, Red Lion Automation Series, "IEC 61131 Logic Control Programming," 2016, 2 pages.
Red Lion Graphite Core Controller, Red Lion Automation Series, "Rugged Standalone Industrial Controller," 2016, 2 pages.
"35 solutions worth seeing at SPS IPC Drives," Vogel Business Media, 2017, 3 pages including English translation.
Red Lion Graphite HMIs, Red Lion Automation Series, "Rugged Operator Panels with Modular I/O," 2017, 4 pages.
Office Action dated Nov. 30, 2021 in connection with European patent application No. 19821065.0, 18 pages Including English translation.
"Simatic, ET 200pro Interfacemodul IM 154-8 CPU," Siemens, Dec. 2006, 280 pages including partial English translation.
Partial Search Report dated Mar. 13, 2020 in connection with International Patent Application No. PCT/EP2019/084699, 27 pages including English translation.
International Search Report and Written Opinion dated Mar. 27, 2020 in connection with International Patent Application No. PCT/EP2019/086344, 32 pages including English translation.
International Search Report and Written Opinion dated Apr. 1, 2020 in connection with International Patent Application No. PCT/EP2019/086359, 30 pages including English translation.
International Search Report and Written Opinion dated Jun. 24, 2020 in connection with International Patent Application No. PCT/EP2019/084699, 37 pages including English translation.
Examination report dated Jun. 8, 2019 in connection with German patent application No. 10 2018 133 646.2, 18 pages Including English translation.
Allen-Bradley, "FlexArmor" 1798 Technical Data, Aug. 2001, 20 pages.
Examination Report dated Aug. 13, 2019 in connection with German patent application No. DE 10 2018 133 657.8, 16 pages including English translation.
Examination Report dated Aug. 8, 2019 in connection with German patent application No. DE 10 2018 133 647.0, 18 pages including English translation.
"Simatic, Dezentrales Peripheriesystem ET 200pro," Siemens, Sep. 2016, 517 pages including partial English translation.
"EtherCAT—the Ethernet Fieldbus," EtherCAT Technology Group, Nov. 2012, 21 pages.
International Search Report and Written Opinion dated Jun. 4, 2020 in connection with International Patent Application No. PCT/EP2020/056494, 31 pages including translation.
International Preliminary Report on Patentability dated Jul. 14, 2021 in connection with International Patent Application No. PCT/EP2020/056494, 33 pages including translation.
Office Action dated Jun. 27, 2022 in connection with Japanese patent application No. 2021-537884, 17 pages including English translation.
Office Action issued in Japanese Patent Application No. 2021-537936, dated Aug. 16, 2022, 18 pages including 12 pages of English translation.

* cited by examiner

SWITCH-CABINET SYSTEM WITH SEALING INSERT

CROSS-REFERENCE TO RELATED APPLICATIONS

This application is a continuation of International Patent Application PCT/EP2020/056494, filed Mar. 11, 2020, entitled SWITCH CABINET SYSTEM WITH SEALING INSERT, which claims the priority of German patent application DE 10 2019 106 082.6, filed Mar. 11, 2019, entitled SCHALTSCHRANKSYSTEM MIT DICHTUNGSEINSATZ, each of which is incorporated by reference herein, in the entirety and for all purposes.

FIELD

The present invention relates to a switch-cabinet system having a sealing insert.

BACKGROUND

A switch-cabinet system comprises electrical and/or electronic components of an automation system. A switch-cabinet system acts as a distribution system. For example, electrical voltages may be distributed by the switch-cabinet system and provided to field devices of an automation system. An automation system may e.g. be used in a manufacturing machine.

DE 100 06 879 A1 discloses a modular control system for control and automation systems with a base module that may be fitted with functional modules. An interface between the base plate and a module housing is located within a sealing ring, which provides a sealing between the base module and a contact surface of the plugged-on functional module. A disadvantage of this sealing concept is that it is not embodied to be redundant.

SUMMARY

An object of the present invention is to provide an improved switch-cabinet system with a sealing insert, an improved functional module with a sealing insert and a sealing insert. These objects are solved by a switch-cabinet system having a sealing insert, a functional module with a sealing insert and a sealing insert with the features of the independent claims. Advantageous further embodiments are indicated in dependent claims.

EXAMPLES

A switch-cabinet system has a base module and at least one functional module. The functional module has a functional housing. The functional housing has a first through-opening on a bottom side. A functional connection element of the functional module is arranged in the functional housing and in the region of the first through-opening. The base module has a base housing. The base housing has a second through-opening on a top side. A base connection element of the base module is arranged in the base housing and in the region of the second through-opening. The bottom side of the functional housing rests against the top side of the base housing. The functional connection element and the base connection element engage with each other and form an interface. The switch-cabinet system comprises a sealing insert having a frame. The frame of the sealing insert has a function section engaging with the functional housing and a base section engaging with the base housing. The functional section of the frame abuts on an inner wall of the functional housing. The base section of the frame abuts on a wall of the base housing defining the second through-opening.

Advantageously, the switch-cabinet system may be protected by the sealing insert, e.g. against the intrusion of moisture and/or dust particles, since the functional section of the sealing insert abuts on the inner wall of the functional housing and the base section of the sealing insert abuts on the wall of the base housing surrounding the second through-opening, by which moisture and/or particles penetrating between the bottom side of the functional housing and the top side of the base housing may be prevented from intruding into the switch-cabinet system. The switch-cabinet system may thus e.g. meet the IP67 standard of protection, i.e. the switch-cabinet system may be dust-tight and fully protected against contact and against temporary submersion. This means that electronic components located in the functional housing and in the base housing may be protected from damage, which may prevent a failure of the switch-cabinet system. When using the switch-cabinet system, the switch-cabinet system may therefore be arranged in an environment in which the switch-cabinet system is exposed to humid and/or dusty conditions without danger of failure of the switch-cabinet system. Such an environment may e.g. exist in the vicinity of a manufacturing machine. As an alternative to protection standard IP67, the switch-cabinet system may also meet protection standard IP69k.

Due to the base section of the frame engaging with the base module, the switch-cabinet system offers the additional advantage of guiding the functional module and the functional connection element when mounting the functional module on the base module. This may reduce forces acting on the functional connection element during assembly. Furthermore, in an embodiment not described in more detail, e.g. a printed circuit board may be attached to the sealing insert. In this way, the sealing insert may serve as an assembly aid, since the printed circuit board and the sealing insert may be jointly installed in the functional module.

In an embodiment of the switch-cabinet system, the frame of the sealing insert has a first groove and a second groove. The first groove is formed circumferentially around the functional section of the frame, and the second groove is formed circumferentially around the base section of the frame. A first seal is disposed in the first groove and abuts on the inner wall of the functional housing. A second seal is disposed in the second groove and abuts on the wall of the base housing surrounding the second through-opening.

Advantageously, the first seal may prevent moisture and/or dust particles that enter the switch-cabinet system between the bottom side of the functional housing and the top side of the base housing from intruding into the functional housing. The second seal may prevent moisture and/or dust particles that enter the switch-cabinet system between the bottom of the functional housing and the top of the base housing from intruding into the base housing. In this way, elements arranged in the functional housing and in the base housing, such as printed circuit boards, are additionally protected against the intrusion of moisture and/or dust particles.

In another embodiment of the switch-cabinet system, the bottom side of the functional housing includes a third groove surrounding the first through opening. A third seal is disposed in the third groove and abuts on the top surface of the base housing.

Advantageously, the third seal may prevent moisture and/or dust particles from intruding into the switch-cabinet system between the bottom side of the functional housing and the top side of the base housing. As a result, the functional module and the base module are additionally protected against the intrusion of moisture and/or dust particles. In combination with the first seal and the second seal, the switch-cabinet system is particularly well sealed against such intrusion of moisture and/or dust particles since the switch-cabinet system has a redundant sealing concept: if the third seal leaks, the first seal and the second seal may still provide protection against the intrusion of moisture and/or dust particles. Thus, compared to the state of the art, the switch-cabinet system provides increased safety with regard to the sealing concept.

In an embodiment of the switch-cabinet system, the sealing insert has a cover rigidly connected to the frame. The cover is disposed within an area delimited by the frame. The cover has a recess. The interface is arranged in the area of the recess.

Advantageously, components of the functional module arranged in the functional housing are protected against contact by the cover. This may e.g. be appropriate during initial assembly, replacement or repair of the functional module, i.e. when the functional module is separated from the base module.

In another embodiment of the switch-cabinet system, the cover has at least one further recess. Advantageously, the at least one further recess enables heat to be dissipated from the functional housing into the base housing through the further recess.

In an embodiment of the switch-cabinet system, the sealing insert comprises at least two retaining sections rigidly connected to the frame. The retaining sections extend in a direction perpendicular to the frame and project into the functional housing. The retaining sections are accessible via the further recesses. The sealing insert is fixed to the functional housing at the retaining sections.

Advantageously, the retaining sections are accessible through the further recesses, allowing the sealing insert to be fastened to the inner wall of the functional housing e.g. by screws. The section of the frame of the sealing insert that rests against the inner wall of the functional housing forms the functional section of the frame. The section of the frame of the sealing insert located outside the functional housing forms the base section of the frame.

In another embodiment of the switch-cabinet system, the functional connection element does not protrude further from the functional housing than the frame of the sealing insert. Advantageously, the functional connection element is protected against mechanical impact by not protruding further out of the functional housing than the frame of the sealing insert.

A functional module for a switch-cabinet system has a functional housing. The functional housing has a first through-opening on a bottom side. A functional connection element of the functional module is arranged in the functional housing and in the area of the first through-opening. The functional module comprises a sealing insert having a frame. The frame of the sealing insert has a functional section engaging with the functional housing and a base section arranged outside of the functional housing. The functional section of the frame abuts on an inner wall of the functional housing. Advantageously, when the functional module is used in the switch-cabinet system, a switch-cabinet system may be protected by the sealing insert e.g. against the intrusion of moisture and/or dust particles.

In an embodiment of the functional module, the frame of the sealing insert has a first groove and a second groove. The first groove is formed circumferentially around the functional section of the sealing insert, and the second groove is formed circumferentially around the base section of the sealing insert. A first seal is disposed in the first groove and abuts on the inner wall of the functional housing. A second seal is disposed in the second groove. Advantageously, a switch-cabinet system may be additionally protected against the penetration of moisture and/or dust particles by the first and second seals when the functional module is used in the switch-cabinet system.

In another embodiment of the functional module, the bottom side of the functional housing has a third groove surrounding the first through-opening. A third seal is arranged in the third groove. Advantageously, a switch-cabinet system may be additionally protected against the intrusion of moisture and/or dust particles by the third seal when the functional module is used in the switch-cabinet system.

In a further embodiment of the functional module, the sealing insert has a cover rigidly connected to the frame. The cover is arranged within an area delimited by the frame. The cover comprises a recess. The functional connection element is arranged in the area of the recess. Advantageously, components of the functional module arranged in the functional housing are protected against contact by the cover.

In an embodiment of the functional module, the cover comprises at least one further recess. Advantageously, the at least one further recess enables heat to be dissipated from the functional housing through the further recess into a base housing of the switch-cabinet system when the functional module is used in a switch-cabinet system.

In another embodiment of the functional module, the sealing insert has at least two retaining sections rigidly connected to the frame. The retaining sections extend in a direction perpendicular to the frame and project into the functional housing. The retaining sections are accessible through the further recesses. The sealing insert is fixed to the retaining sections on the functional housing. Advantageously, the retaining sections are accessible through the further recesses, allowing the sealing insert to be fastened to the inner wall of the functional housing, e.g. by screws.

In a further embodiment of the functional module, the functional connection element does not protrude further from the functional housing than the frame of the sealing insert. Advantageously, the functional connection element is protected against mechanical impact by not protruding further out of the functional housing than the frame of the sealing insert.

BRIEF DESCRIPTION OF THE DRAWINGS

The above-described properties, features and advantages of the present invention, as well as the manner in which they are achieved, will be clearer and more clearly understood in connection with the following description of the embodiments, which will be explained in more detail in connection with the drawings. Thereby, in each case, schematic illustrations show.

DETAILED DESCRIPTION

Figure 1:
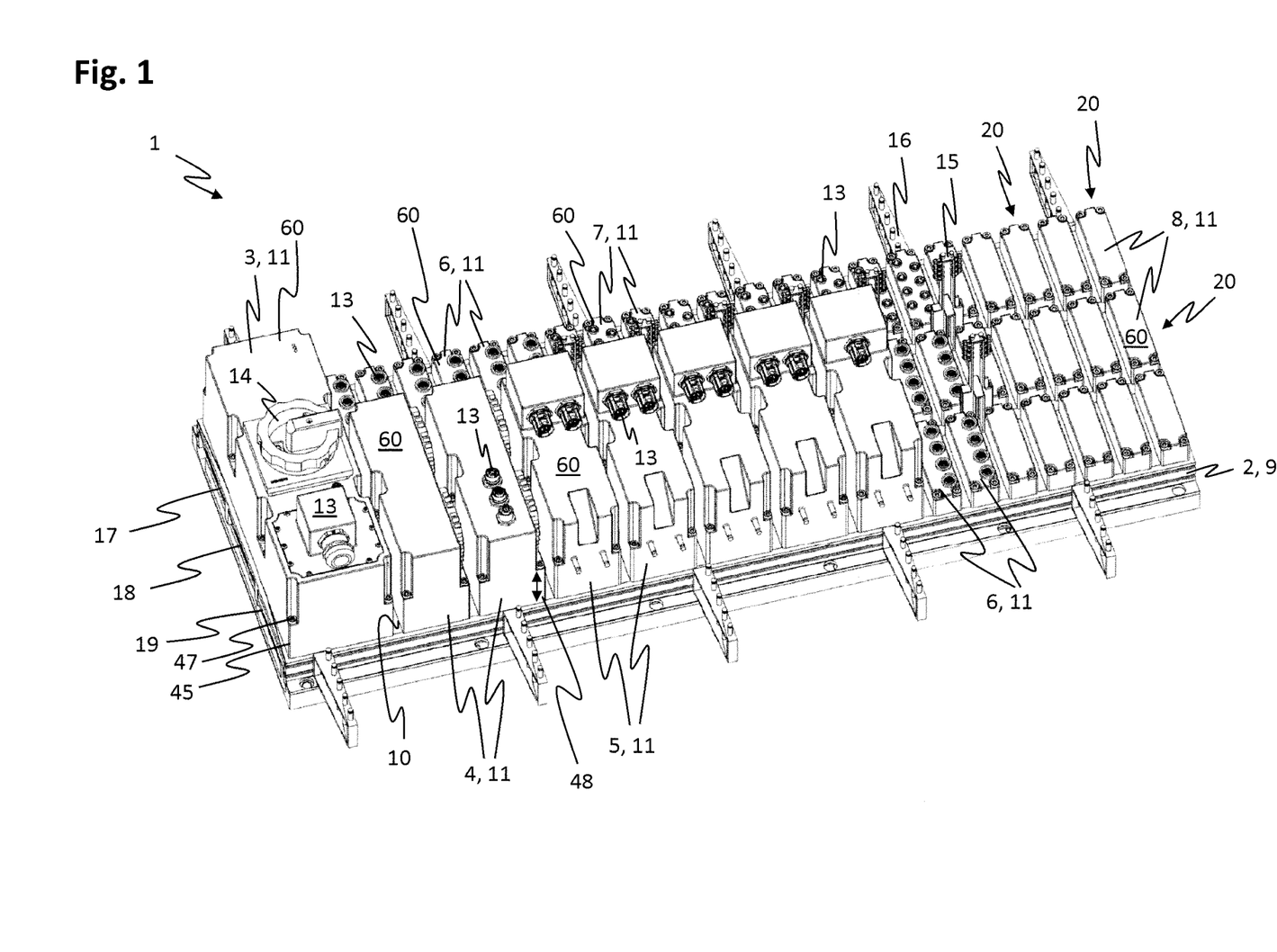
FIG. 1: a switch-cabinet system in a perspective view.

FIG. 1 schematically shows an exemplary switch-cabinet system 1 in a perspective view.

The switch-cabinet system 1 comprises a base module 2 and at least one functional module 60. The generally described functional module 60 may e.g. be embodied as, a first functional module 3, a second functional module 4, a third functional module 5, a fourth functional module 6, a fifth functional module 7 or a sixth functional module 8. However, any other embodiment of the functional module 60 is conceivable, as well. Insofar as the features described below apply to both the first functional module 3, the second functional module 4, the third functional module 5, the fourth functional module 6, the fifth functional module 7 and the sixth functional module 8, only general reference will be made to the functional module 60 or the functional modules 60.

By way of example, the switch-cabinet system 1 of FIG. 1 has a first functional module 3, two second functional modules 4, five third functional modules 5, ten fourth functional modules 6, ten fifth functional modules 7 and fifteen sixth functional modules 8. However, the switch-cabinet system 1 may also have any number of first functional modules 3, second functional modules 4, third functional modules 5, fourth functional modules 6, fifth functional modules 7, sixth functional modules 8, and/or also other functional modules.

The base module 2 comprises a base housing 9 having a top side 10. The functional modules 60 each comprise a functional housing 11 with a bottom side 12. The bottom sides 12 of the functional modules 60 each rest against the top side 10 of the base housing 9. For this reason, the bottom sides 12 of the functional modules 60 are not visible in FIG. 1.

Except for the sixth functional module 8, the remaining first functional modules 3, second functional modules 4, third functional modules 5, fourth functional modules 6 and/or fifth functional modules 7 may each have peripheral connection elements 13, as shown accordingly in FIG. 1. A number, an embodiment and positions of the peripheral connection elements 13 may differ from the exemplary depiction of FIG. 1 for all first to fifth functional modules 3, 4, 5, 6, 7. Field devices may be connected to the switch-cabinet system 1 through the peripheral connections 13. The field devices may e.g. be actuators and/or sensors. The field devices may e.g. be part of a manufacturing machine that may be controlled by the switch-cabinet system 1. The field devices may exchange data, signals or supply voltages with the functional modules 60 via the peripheral connections 13. The base module 2 of the switch-cabinet system 1 may e.g. comprise application-specific integrated circuits which, in conjunction with the first to fifth functional modules 3, 4, 5, 6, 7, act as slaves or masters in order to be able to control the field devices in an automated manner according to the master-slave principle. In this context, the data may be exchanged between the first to fifth functional modules 3, 4, 5, 6, 7 via the base module 2, e.g. using an EtherCAT protocol according to the IEC 61158 standard. Furthermore, the switch-cabinet system 1 may act as a distribution system for electrical voltages that may be provided to the field devices for an operation.

The first functional module 3 comprises a control element 14 as an example. The first functional module 3 may be regarded as a higher-level functional module. For example, data and voltages may be fed into the first functional module 3 and forwarded to the other second to sixth functional modules 4, 5, 6, 7, 8.

By way of example, the base module 2 comprises a first channel 17, a second channel 18, and a third channel 19. However, the base module 2 may also comprise only the first channel 17 or only the first channel 17 and the second channel 18 or even more than the three first to third channels 17, 18, 19. The functional housings 11 of the fourth functional modules 6, the fifth functional modules 7 and the sixth functional modules 8 each exemplarily extend only over the first channel 17, the second channel 18 or the third channel 19 of the base module 2. The second functional modules 4 and the third functional modules 5 each exemplarily extend over the second channel 18 and the third channel 19. The first functional module 3 exemplarily extends over all three first to third channels 17, 18, 19.

By way of example, the base module 2 comprises a total of twenty-four slots 20 per first to third channels 17, 18, 19. However, the base module 2 may comprise any number of slots 20 per first to third channels 17, 18, 19. The fourth functional modules 6, the fifth functional modules 7 and the sixth functional modules 8 each extend over one slot 20. The second functional modules 4 and the third functional modules 5 each extend over four slots 20. The first functional module 3 extends over nine slots 20.

The switch-cabinet system 1 comprises first and second cable-guiding elements 15, 16. The first cable-guiding elements 15 are arranged on the top side 10 of the base module 2 between the functional modules 60 and extend in a direction perpendicular to the top side 10 of the base housing 9. The second cable-guiding elements 16 are arranged on the side of the base housing 9 and extend in a direction parallel to the top side 10 of the base housing 9. A number of first and second cable-guiding elements 15, 16 may be arbitrary. Also, an arrangement of the first and second cable-guiding elements 15, 16 may differ from the arrangement shown in FIG. 1. The first and/or second cable-guiding elements 15, 16 may also be omitted.

Figure 2:
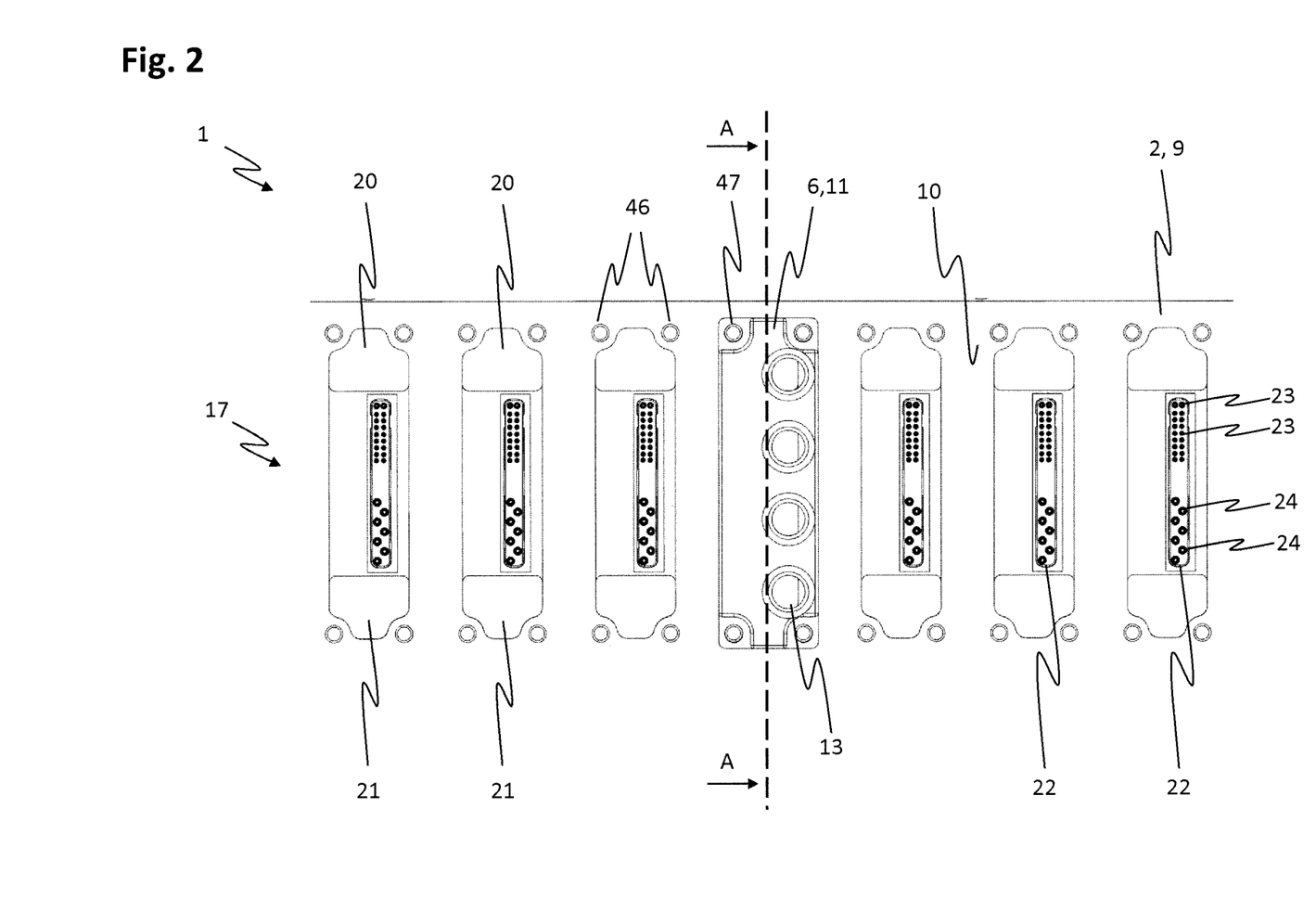
FIG. 2: a top view of a section of the switch-cabinet system of FIG. 1.

FIG. 2 shows a schematic top view of a section of the switch-cabinet system 1 of FIG. 1. The section shows only part of the first channel 17 of the base module 2 and, by way of example, a fourth functional module 6, which is arranged in the area of the first channel 17 on the top side 10 of the base housing 9. Functional modules adjacent to the fourth functional module 6 are shown in FIG. 1 for the sake of clarity.

The base housing 9 has second through-opening 21 on its top side 10. A second through-opening 21 is provided for each slot 20. Base connection elements 22 of the base module 2 are arranged in the base housing 9 and in each case in the area of the second through-openings 21. The base connection elements 22 may be embodied either as built-in plugs or as built-in sockets. By way of example, the base connection elements 22 of FIG. 2 are embodied as built-in sockets.

By way of example, the base connection elements 22 comprise eighteen first contact openings 23 and seven second contact openings 24. However, the base connection elements 22 may also have a different number of first and second contact openings 23, 24. Positions of the first and second contact openings 23, 24 may differ from the positions shown in FIG. 2.

Figures 3A, 3B:
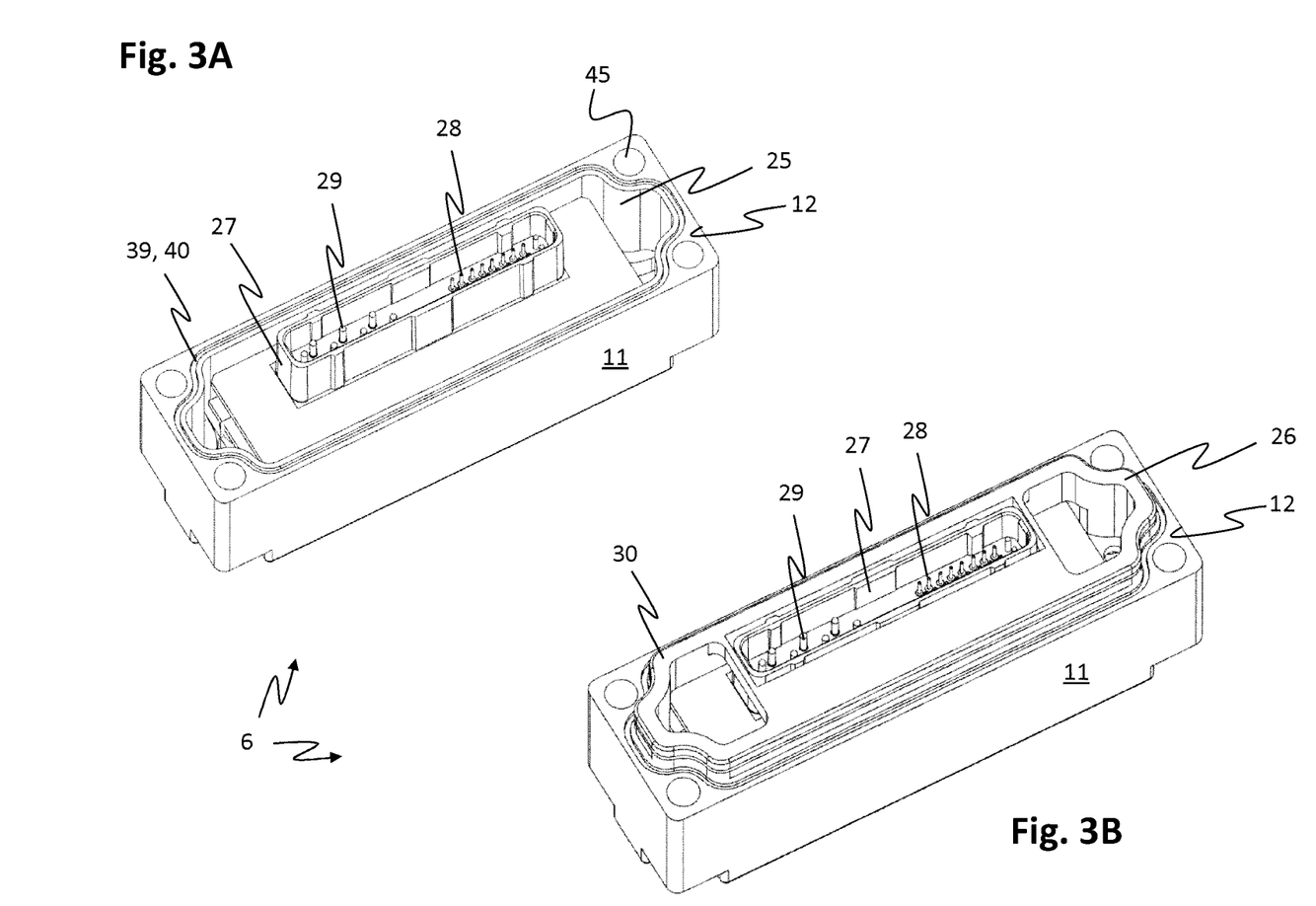
FIGS. 3A and 3B: various perspective views of a bottom side of a functional module of the switch-cabinet system.

FIGS. 3A and 3B schematically show different perspective views of the bottom side 12 of the functional housing 11 of the fourth functional module 6 of the switch-cabinet system 1. FIG. 3A shows the fourth functional module 6 without a sealing insert 26, while FIG. 3B shows the fourth functional module 6 with a sealing insert 26.

The functional housing 11 comprises a first through-opening 25 on its bottom side 12. A cross-section of the first through-opening 25 of the functional housing 11 may be identical to a cross-section of a second through-opening 21 of the base housing 9, but this is not mandatory. In the switch-cabinet system 1, when the bottom side 12 of the functional housing 11 is in contact with the top side 10 of the base housing 9, the first through-opening 25 and the second through-opening 21 are arranged one above the other.

A functional connection element 27 is arranged in the functional housing 11 and in the area of the first through-opening 25. The functional connection element 27 may be embodied either as a built-in plug or as a built-in socket. By way of example, functional connection element 27 is embodied as a built-in plug.

The functional connection element 27 comprises eighteen first contact pins 28 and seven second contact pins 29 corresponding to the number of first and second contact openings 23, 24 of the base connection element 22. In the switch-cabinet system 1, a base connection element 22 and the functional connection element 27 engage with each other and form an interface. Data may be exchanged between the base module 2 and the fourth functional module 6 via the interface. Electrical voltages may also be provided to the fourth functional module 6 by the base module 2.

The sealing insert 26 of the fourth functional module 6 comprises a frame 30, which engages in the functional housing 11. The functional connection element 27 may be arranged in such a way that it does not protrude further over the functional housing 11 than the frame 30 of the sealing insert 26. As a result, the functional connection element 27 is also protected against mechanical loads when the fourth functional module 6 is removed from the switch-cabinet system 1.

Figures 4A, 4B:
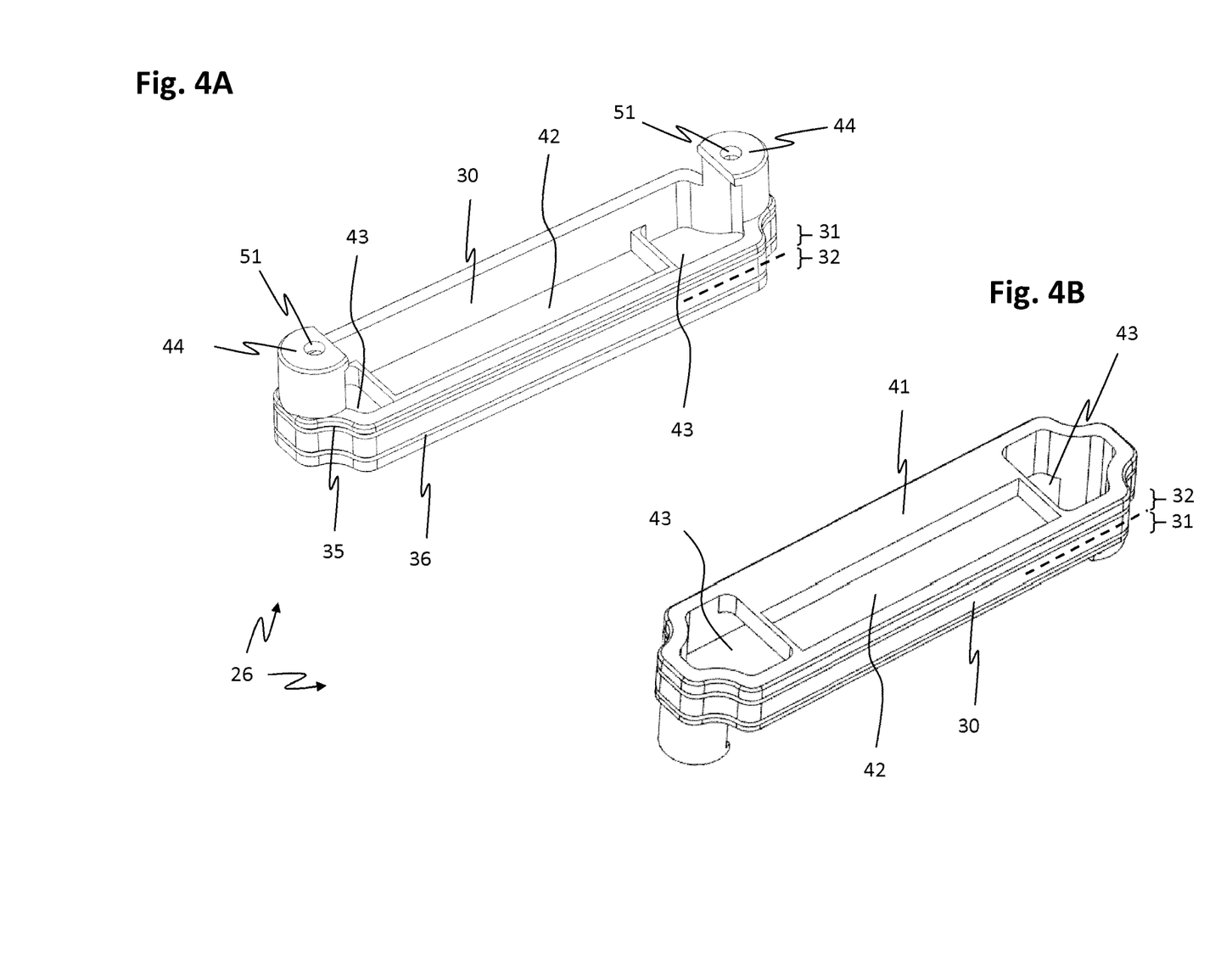
FIGS. 4A and 4B: a sealing insert of the functional module in various perspective views.

FIGS. 4A and 4B schematically show the sealing insert 26 of the fourth functional module 6 in various perspective views.

The frame 30 of the sealing insert 26 has a functional section 31 and a base section 32. The functional section 31 engages in the functional housing 11, which is why the functional section 31 is not visible in FIGS. 3A and 3B. The base section 32 of the frame 30 engages with the base housing 9. The base section 32 of the frame is arranged outside of the functional housing 11.

Figure 5:
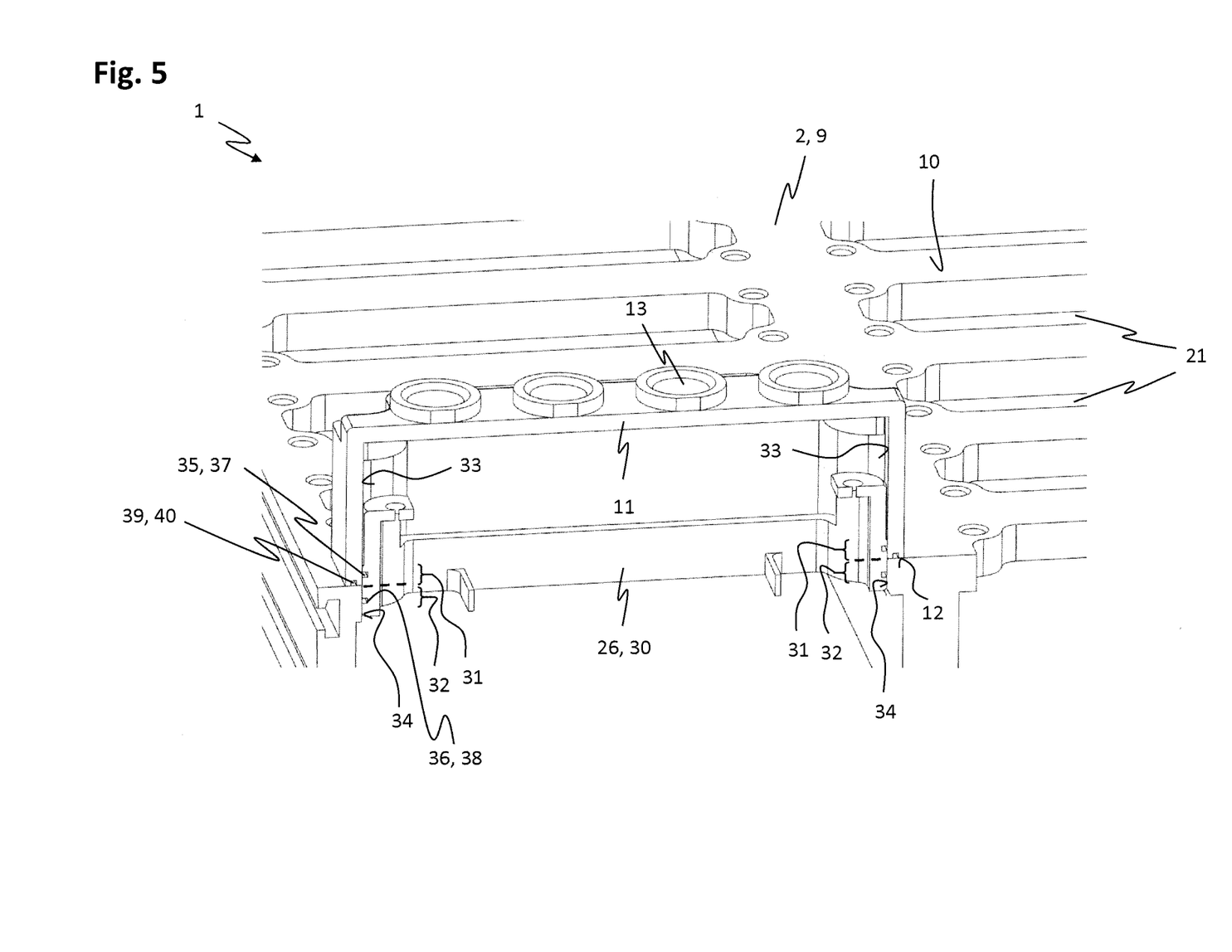
FIG. 5: a perspective cross-sectional view of the switch-cabinet system.
Figure 6:
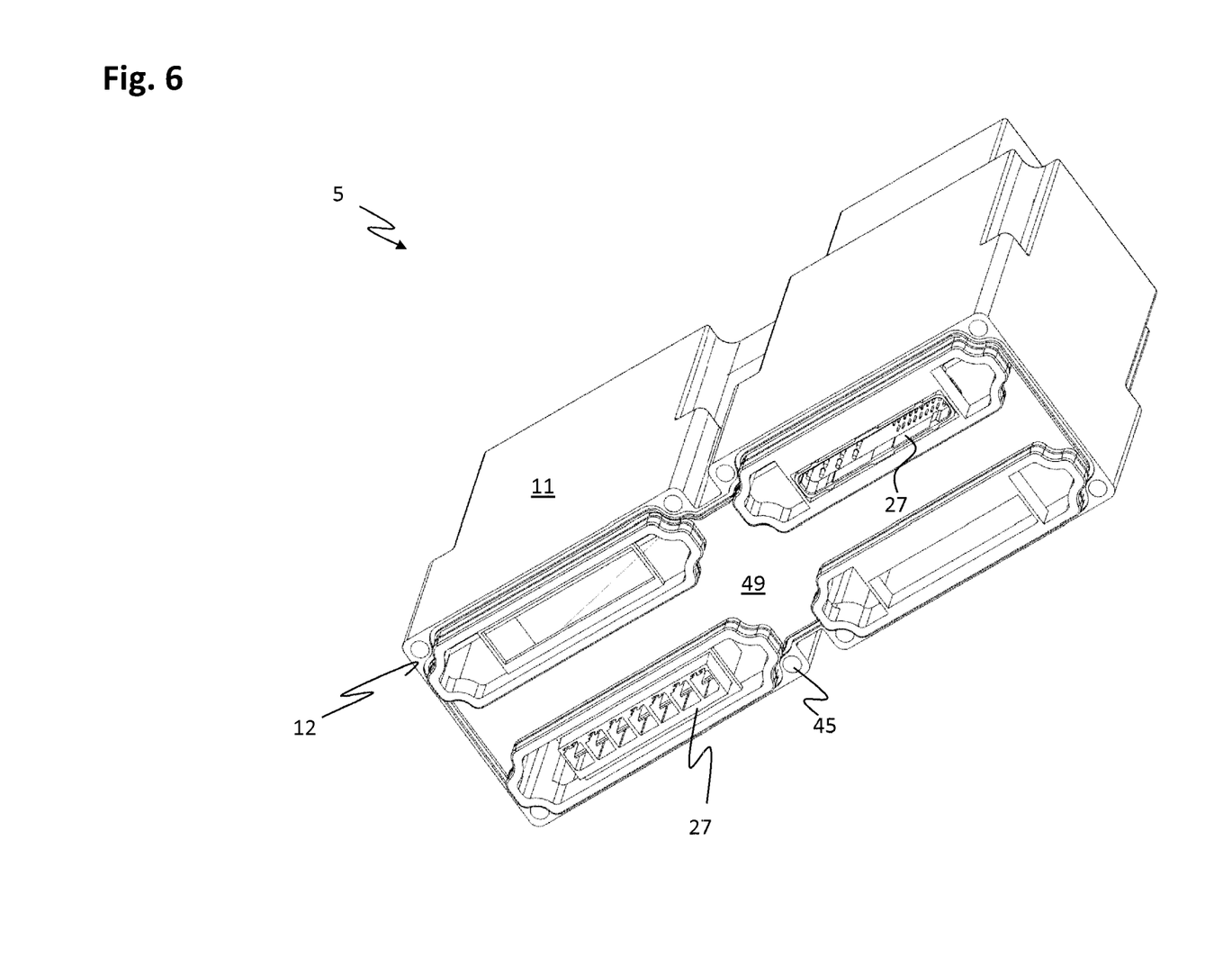
FIG. 6: a further functional module in a perspective view of a bottom side on the further functional module.

FIG. 5 schematically shows a perspective cross-sectional view A-A of a plane indicated by a dashed line in FIG. 2, which runs through the switch-cabinet system 1. The base connection elements 22 and the functional connection element 27 are shown in FIGS. 2 and 6 for the sake of clarity.

The functional section 31 of the frame 30 abuts on an inner wall 33 of the functional housing 11. The base section 32 of the frame 30 abuts on a wall 34 of the base housing 9 surrounding the second through-opening 21. Advantageously, the sealing insert 26 may protect the switch-cabinet system 1 e.g. against the intrusion of moisture and/or dust particles. Since the functional section 31 of the sealing insert 26 abuts on the inner wall 33 of the functional housing 11, and the base section 32 of the sealing insert 26 abuts on the wall 34 of the base housing 9 defining the second through-opening 21, moisture and/or particles penetrating between the bottom side 12 of the functional housing 11 and the top side 10 of the base housing 9 may be prevented from intruding into the switch-cabinet system 1.

The frame 30 of the sealing insert 26 comprises a first groove 35 and a second groove 36. The first groove 35 is formed circumferentially around the functional section 31 of the frame 30, and the second groove 36 is formed circumferentially around the base section 32 of the frame 30, which may also be seen in FIGS. 4A and 4B. A first seal 37 is arranged in the first groove 35. The first seal 37 abuts on the inner wall 33 of the functional housing 11. The first seal 37 may e.g. be an injection molded seal. A second seal 38 is arranged in the second groove 36 and abuts on the wall 34 of the base housing 9 surrounding the second through-opening 21. The second seal 38 may e.g. be an injection-molded seal, as well.

The bottom side 12 of the functional housing 11 comprises a third groove 39 surrounding the first through-opening 25. A third seal 40 is arranged in the third groove 39 and abuts on the top surface 10 of the base housing 9. The third seal 40 may e.g. be an O-ring.

Advantageously, the first seal 37, the second seal 38 and the third seal 40 enable the switch-cabinet system 1 to meet the IP69k or IP67 standard of protection. However, the first seal 37 and the second seal 38 may also be omitted. The third seal 40 may be omitted, as well. If one of the first, second and/or third seals 37, 38, 40 is not provided, the corresponding first, second and/or third groove 35, 36, 39 in which the respective first, second and/or third seal 37, 38, 40 is arranged is also omitted.

Further optional features of the sealing insert 26 of the switch-cabinet system 1 are explained below with reference to FIGS. 4A and 4B and FIG. 5.

The sealing insert 26 includes a cover 41 rigidly connected to the frame 30. The cover 41 is arranged within an area delimited by the frame 30. Exemplarily, the cover 41 is arranged in the area of the base section 32. The cover 41 comprises a recess 42. The functional connection element 27 is arranged in the area of the recess 42. In the switch-cabinet system 1, the interface is arranged in the area of the recess 42, i.e. the functional connection element 27 and the base connection element 22 engaging in the functional connection element 27 are arranged in the area of the recess 42.

By way of example, the cover 41 has two further recesses 43. However, the sealing insert 26 may also comprise any number of further recesses 43. The further recesses 43 of the cover 41 offer the advantage that cooling air may be exchanged between the base module 2 and the fourth functional module 6, so that components arranged in the functional housing 22 of the fourth functional module 6, such as a circuit board, may be cooled.

Exemplarily, the sealing insert 26 comprises two retaining sections 44 rigidly connected to the frame 30. The retaining sections 44 are exemplarily arranged on opposite sides of the sealing insert 26. However, the sealing insert 26 may also include any number of retaining sections 44. The retaining sections 44 extend into the functional housing 11 in a direction perpendicular to the frame 30 and extend. The retaining sections 44 are accessible through the further recesses 43. The further recesses 43 enable the sealing insert 26 to be fixed to the functional housing 11 with a tool.

The sealing insert 26 is fixed to the retaining sections 44 on the functional housing 11. The sealing insert 26 may e.g. be fixed to the functional housing 11 by screws. For this purpose, the retaining sections 44 each have an opening 51. The inner wall 33 of the functional housing 11 may e.g. have blind holes for fastening the sealing insert 26.

The further recesses 43 may also be omitted. In this case, the retaining sections 44 of the sealing insert 26 may be omitted, as well. Alternatively, however, the cover 41 may be omitted. Optional retaining sections 44 would then also be accessible with a tool.

Further optional features of the switch-cabinet system 1 are explained below with reference to FIGS. 1, 2 and 3A.

The functional housings 11 of the functional modules 60 each include a plurality of screw channels 45 formed perpendicular to their bottom sides 12. The screw channels 45 are each arranged around the first through-opening 25 of the functional housings 11. The base housing 9 includes a plurality of blind holes 46 on its top side 10. The blind holes 46 are arranged around second through openings 21. Screws 47 extend through the screw channels 45, respectively, and are screwed into the blind holes 46.

For example, a height 48 of the screw channels 45 dimensioned with respect to the bottom sides 12 of the functional housings 11 may correspond to at least half of a difference between a maximum lateral distance of the screw channels 45 with regard to one another and a screw head diameter of the screws 47 used. This may ensure that a uniform pressure is exerted onto a third seal 40 by the screws 47, since the pressure cones of two adjacent screws 47 intersect in the sealing surface of the third seal 40. If, on the other hand, the height 48 of the screw channels 45 is less than half the difference between the maximum lateral distance between the screw channels 45 and the screw head diameter of the screws 47 used, it may be that a third seal 40 is arranged section-wise outside of pressure cones of the screws 47. However, depending on the application, such a pressure effect on a third seal 40 may also be sufficient to achieve a desired sealing effect.

However, the screw channels 45, the blind holes 46 and the screws 47 may also be omitted. Alternatively, another mechanism may be provided to attach the functional modules 60 to the base module 2. For example, clips may be provided on the base module 2 into which the functional modules 60 may engage.

FIG. 6 schematically shows the third functional module 5 in a perspective view of the bottom side 12.

In contrast to the fourth functional module 6, which occupies only one slot 20 on the base module 2, the third functional module 5 occupies four slots 20 and thereby extends over the second and third channels 18, 19. In principle, a functional module 60 may extend over any number of slots 20 and first to third channels 17, 18, 19. As an example, however, the third functional module 5 of FIG. 6 comprises only two functional connection elements 27. The two functional connection elements 27 of the third functional module 5 do not have to be diagonally opposite each other, as exemplarily shown in FIG. 6. FIG. 6 exemplarily indicates that the functional connection elements 27 of the third functional module 5 are formed differently, which is not necessary, either. The third functional module 5 may also have only one, three or four functional connection elements 27, which may have an identical or different embodiment.

Figure 7:
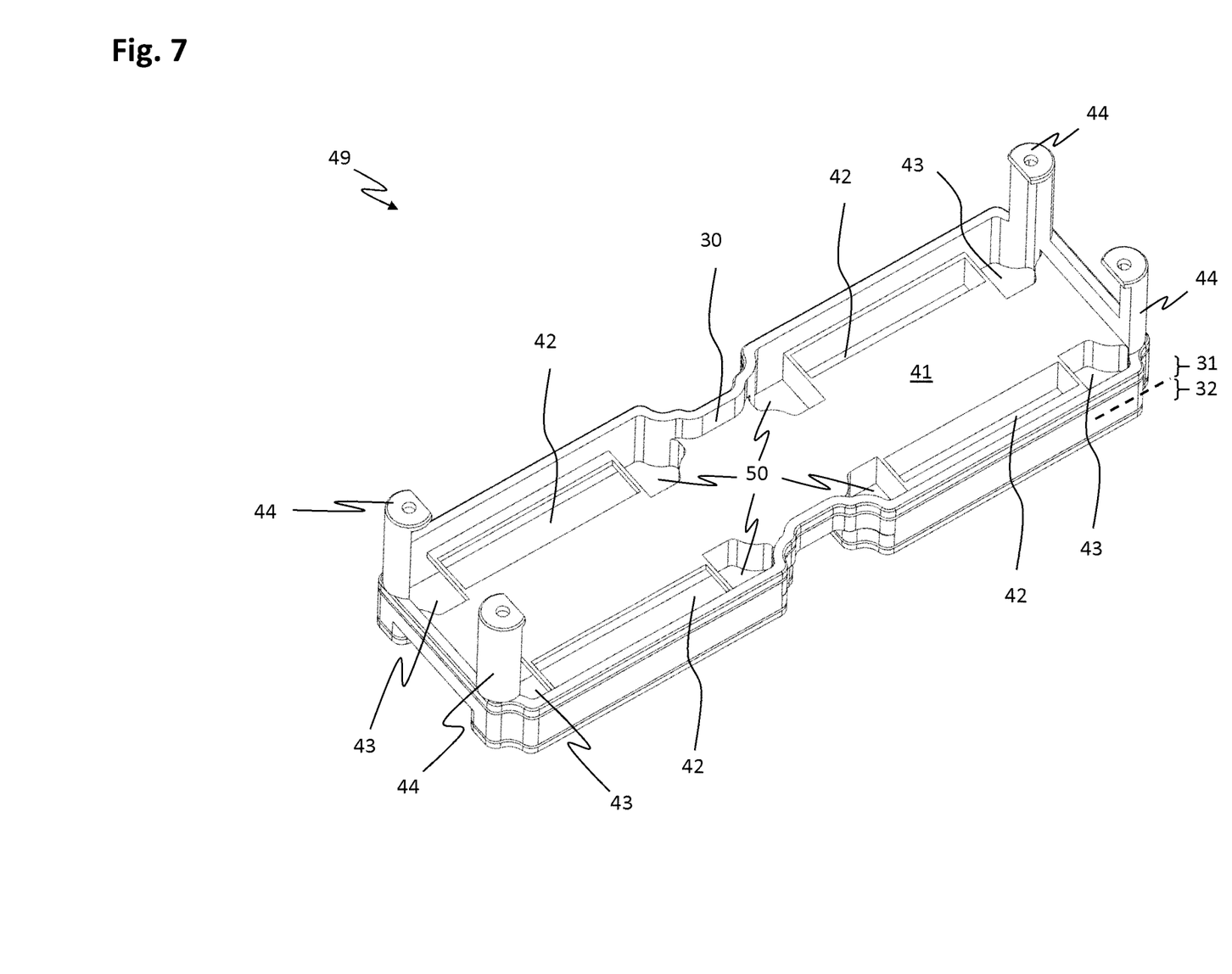
FIG. 7: a further sealing insert for the further functional module in a perspective view.

The third functional module 5 has a further sealing insert 49. FIG. 7 schematically shows the further sealing insert 49 for the third functional module 5 in a perspective view. The further sealing insert 49 has similarities compared to the sealing insert 26. The reference signs for the sealing insert 26 are retained for the further sealing insert.

The further sealing insert 49 comprises a frame 30. The frame 30 comprises a functional section 31 and a base section 32. The functional section 31 of the further sealing insert 49 is embodied to engage the functional housing 11 of the third functional module 5, while the base section 32 is configured to engage the base housing 9. The further sealing insert 49 includes a cover 41. The cover 41 is arranged within an area delimited by the frame 30. By way of example, the cover 41 is arranged in the area of the base section 32. The cover 41 may also be omitted. Compared to the sealing insert 26, the further sealing insert 49 has four optional recesses 42, four optional further recesses 43, four optional retaining sections 44, and four optional additional recesses 50.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

The invention claimed is:

1. A switch-cabinet system comprising:
   a base module, and
   at least one functional module,
   wherein the functional module comprises a functional housing,
   wherein the functional housing has a first through-opening on a bottom side,
   wherein a functional connection element of the functional module is arranged in the functional housing and in an area of the first through-opening,
   wherein the base module comprises a base housing,
   wherein the base housing comprises a second through opening at a top side,
   wherein a base connection element of the base module is arranged in the base housing and in an area of the second through opening,
   wherein the functional housing rests against the top side of the base housing with its bottom side,
   wherein the functional connection element and the base connection element engage and form an interface,
   wherein the switch-cabinet system comprises a sealing insert with a frame,
   wherein the frame of the sealing insert comprises a functional section engaging in the functional housing and a base section engaging in the base housing,
   wherein the functional section of the frame abuts on an inner wall of the functional housing,
   wherein the base section of the frame abuts on a wall of the base housing defining the second through-opening,
   wherein the frame of the sealing insert comprises a first groove and a second groove,
   wherein the first groove is formed circumferentially around the functional section of the frame and the second groove is formed circumferentially around the base section of the frame,
   wherein a first seal is arranged in the first groove and abuts on the inner wall of the functional housing,
   wherein a second seal is arranged in the second groove and abuts on the wall of the base housing surrounding the second through opening,
   wherein the bottom side of the functional housing comprises a third groove surrounding the first through opening, and
   wherein a third seal is arranged in the third groove and abuts on the top side of the base housing.

2. The switch-cabinet system according to claim 1,
wherein the sealing insert comprises a cover rigidly connected to the frame,
wherein the cover is arranged within an area delimited by the frame,
wherein the cover comprises a recess, and
wherein the interface is arranged in the area of the recess.

3. The switch-cabinet system according to claim 2, wherein the cover comprises at least one further recess.

4. The switch-cabinet system according to claim 3,
wherein the sealing insert comprises at least two retaining sections rigidly connected to the frame,
wherein the retaining sections extend in a direction perpendicular to the frame and project into the functional housing,
wherein the retaining sections are accessible via the further recesses, and
wherein the sealing insert is fixed to the functional housing at the retaining sections.

5. The switch-cabinet system according to claim 1, wherein the functional connection element does not protrude further from the functional housing than the frame of the sealing insert.

6. A functional module for a switch-cabinet system,
wherein the functional module comprises a functional housing,
wherein the functional housing has a first through-opening on a bottom side,
wherein a functional connection element of the functional module is arranged in the functional housing and in an area of the first through-opening,
wherein the functional module comprises a sealing insert having a frame,
wherein the frame of the sealing insert comprises a functional section engaging in the functional housing and a base section arranged outside of the functional housing,
wherein the functional section of the frame abuts on an inner wall of the functional housing,
wherein the frame of the sealing insert comprises a first groove and a second groove,
wherein the first groove is formed circumferentially around the functional section of the sealing insert and the second groove is formed circumferentially around the base section of the sealing insert,
wherein a first seal is arranged in the first groove and abuts on against the inner wall of the functional housing,
wherein a second seal is arranged in the second groove, wherein the bottom side of the functional housing comprises a third groove surrounding the first through opening, and
wherein a third seal is arranged in the third groove.

7. The functional module according to claim 6,
wherein the sealing insert comprises a cover rigidly connected to the frame,
wherein the cover is arranged within an area delimited by the frame,
wherein the cover comprises a recess, and
wherein the functional connection element is arranged in the area of the recess.

8. The functional module according to claim 7, wherein the cover comprises at least one further recess.

9. The functional module according to claim 8,
wherein the sealing insert has at least two retaining sections rigidly connected to the frame,
wherein the retaining sections extend in a direction perpendicular to the frame and project into the functional housing,
wherein the retaining sections are accessible via the further recesses, and
wherein the sealing insert is fixed to the functional housing at the retaining sections.

10. The functional module according to claim 6, wherein the functional connection element does not protrude further from the functional housing than the frame of the sealing insert.

11. A sealing insert configured for a switch-cabinet system according to claim 1.

* * * * *